United States Patent [19]
Pfeiffer

[11] Patent Number: 5,400,025
[45] Date of Patent: Mar. 21, 1995

[54] TEMPERATURE CORRECTED INTEGRATING ANALOG-TO-DIGITAL CONVERTER

[75] Inventor: Frederick R. Pfeiffer, Shoreview, Minn.

[73] Assignee: Honeywell Inc., Minneapolis, Minn.

[21] Appl. No.: 40,821

[22] Filed: Mar. 31, 1993

[51] Int. Cl.⁶ .............................................. H03M 1/06
[52] U.S. Cl. ........................................ 341/119; 341/166
[58] Field of Search ........................ 341/119, 166, 167

[56] References Cited

U.S. PATENT DOCUMENTS

| | | | |
|---|---|---|---|
| 4,168,492 | 9/1979 | Uya | 341/119 |
| 4,764,752 | 8/1988 | Ormond | 341/166 |
| 5,014,058 | 5/1991 | Horn | 341/166 |
| 5,128,676 | 7/1992 | Ordway | 341/167 |
| 5,254,992 | 10/1993 | Keen et al. | 341/119 |

FOREIGN PATENTS DOCUMENTS

2,034,992, 6/1980 Great Britian

Primary Examiner—Marc S. Hoff
Attorney, Agent, or Firm—Robert A. Pajak

[57] ABSTRACT

Disclosed is an integrating analog-to-digital converter characterized as a function of the temperature. The characterizing information is processed in a manner to correct the digital information before the digital information is subsequently processed by other system processors.

22 Claims, 4 Drawing Sheets

5,400,025

TEMPERATURE CORRECTED INTEGRATING ANALOG-TO-DIGITAL CONVERTER

BACKGROUND OF THE INVENTION

The present invention is broadly related to integrating analog-to-digital converters. More particularly, the present invention is directed to precision analog-to-digital converters for converting an analog accelerometer output signal to a digital representation thereof, useful for navigational systems.

As is well understood in the navigational arts, a navigational computer requires the information of three (3) accelerometers and three (3) gyroscopes providing acceleration and rotation information along and about three (3) orthogonal coordinate axes. A navigation system processor takes this information and solves navigation system equations in order to give precise global position information. Such systems are commonly employed on both military and commercial aircraft and water craft, and including such applications as submarines and space vehicles.

A navigation system processor, employing, e.g. a computer, microprocessors, or the like, requires the gyroscopic and acceleration information be in digital signal form. Accordingly, employment of an analog accelerometer commonly known in the art, generally produces an output that must be converted to a digital signal form, i.e., a digital representation of an analog quantity. Commonly, the analog accelerometer is converted by the employment of a precision integrating analog-to-digital converter and provides a digital number representation where each digital number increment represent a velocity increment—i.e., integrated acceleration.

In order to provide precision navigational systems, the ambient temperature of the components must be taken into consideration in order to provide precision navigation data. Therefore, employment of an analog accelerometer requires compensation and/or correction due to variations in the accelerometer's analog output signal as a function of accelerometer temperature.

Accordingly, the integrating analog-to-digital converter is designed with precision components having minimal temperature coefficients in order to enhance precision digital information representative of the acceleration sensed by the accelerometer. Secondly, systems of the prior art employ a temperature sensor for sensing the temperature of the accelerometer. Commonly, either the sensor manufacturer or user will characterize the accelerometer as a function of the sensor ambient temperature. Usually the characterization is in the form of accelerometer scale factor and bias as a polynomial function of temperature. In turn, this characterization information is utilized by the navigation processor to correct digital information from the integrating analog-to-digital converter in order to provide compensated and/or corrected navigation information.

Because the precision of the navigation system is dependent upon both the accelerometer and the integrating analog-to-digital converter, temperature characterization alone of the accelerometer is insufficient for a high precision navigation system information. For enhanced performance, temperature characterization of the integrating analog-to-digital converter is necessitated to provide more precise navigation system information.

SUMMARY OF THE INVENTION

An object of the present invention is to provide a temperature characterized precision integrating analog-to-digital converter.

Another object of this invention is to provide precision digital information related to the analog accelerometer output signal.

In the present invention, an integrating analog-to-digital converter is characterized as a function of temperature. The characterizing information is processed in a manner to correct the digital information before the digital information is subsequently processed by the navigation system processor, either before or after the accelerometer temperature corrections are applied by the system processor. Along with the characterizing information, the temperature of the circuit card or selected components on the card is sensed and utilized in order to apply the characterizing information to raw digital output information in order to provide a corrected digital representation derived from the analog input signal.

DETAILED DESCRIPTION OF THE INVENTION

Figure 1:
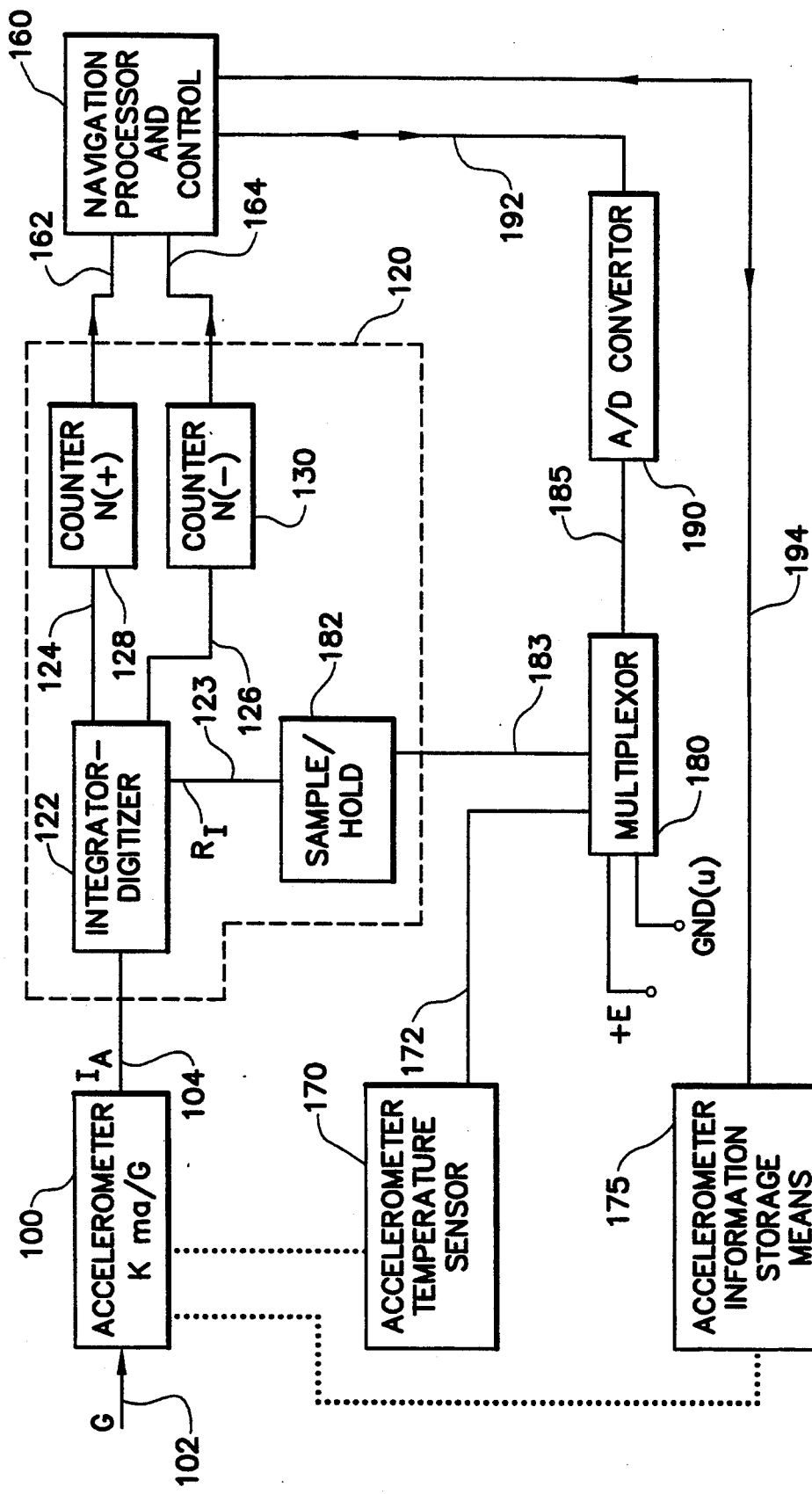
FIG. 1 is a block diagram illustrating an integrating analog-to-digital converter employed with an analog accelerometer for navigational systems of the prior art.

FIG. 1 illustrates a schematic block of diagram of a portion of navigational system utilized in present day commercial aircraft. An analog accelerometer sensor 100 responds to an input acceleration in terms of "G's" 102, and provides an analog output signal on signal line 104 proportional to the sensed acceleration along a predefined input axis. Accelerometer sensors commonly employed convert "G's" of acceleration into current and have a gain in K units of milliamperes per G (units of ft/sec$^2$). The accelerometer output current $I_A$ on signal line 104 generally has a polarity dependent upon the direction of acceleration along the predefined accelerometer input axis.

In turn, the accelerometer output current is provided as an analog input signal to an integrating analog-to-digital converter (herein, IADC) 120. The primary components of the IADC are the integrator digitizer circuit 122, counter 128, and counter 130. The integrator digitizer provides mutually exclusive pulse signals on one or the other output signal lines 124 and 126, thereby representing first and second opposite direction acceleration information. Herein the first direction is referred to "+" and the other direction is referred to as "−." The "+" pulses on signal line 124 are presented as an input to counter 128 and the "−" pulses on signal line 126 are presented to counter 130. The output of counters 128 and 130 are presented as inputs to a navigation processor and control 160 on signal lines 162 and 164, respectively. Herein, (N+) represents the output of counter 128 and (N−) represents the output of counter 130, i.e., the counter values N.

As is well understood in the navigational arts the change in the difference between the counter values represents a velocity increment, i.e., the integral of the acceleration between the two readings of the counters. Herein this difference is defined as DN(−) and DN(+) for the two consecutive counter readings.

Further illustrated in FIG. 1 is an analog accelerometer temperature sensor 170 and accelerometer parameter storage means 175 associated with accelerometer 100 as indicated by the dotted lines there between. Temperature sensor 170 provides an analog output signal on signal line 172 representative of the accelerometer temperature. Usually, the accelerometer unit includes the temperature sensor and temperature sensor output signal terminal connections. Accelerometers with a temperature sensor 170 as just described, are commonly known in the art as manufactured by Sundstrand, Inc.

Accelerometer parameter storage means 175 may be, by way of an example, a read only memory device that contains information that characterizes the performance of the accelerometer as a function of temperature. The contents of storage means 175 may be interrogated by data signal line 194 representing one of more signal lines e.g., a data bus, in a manner well known in the art.

Also, as illustrated in FIG. 1, integrator-digitizer 122 provides an output analog signal $R_I$ that represents a residual analog signal that will be discussed below. In turn, the signal $R_I$ is presented to a sample and hold circuit 182 having an output thereof presented as an input to multiplexer 180 on signal line 183. A second input to multiplexer 180 is the analog output of accelerometer temperature sensor 170 on signal line 172. In turn, the output of the multiplexer 180 is presented on signal line 185 to an analog-to-digital (N/D) converter 190 having a digital output presented to navigation processor and control 160 on signal line 192. Lastly, as illustrated, navigation processor 160 includes a bi-directional signal line 194 for reading the digital information from the accelerometer parameter storage means 175.

It should be understood by those skilled in the art in digital communications, that a design choice is operating the system with either serial or parallel data signal line connections. Therefore, signal lines 162, 164, 192, and 194 may be considered as one or more signal lines for transferring the intended digital information, the details of which have been omitted from the figure in order to simplify understanding of the present invention. Further control signals and digital read-request signals for multiplexer 180 and the other digital signal components, e.g. counters 128 and 130, and storage means 175, are not shown, but may be controlled by navigation processor and control 160 in a well known manner.

The accelerometer sensor manufacturers generally provide temperature characteristic information so that the digitized analog signal may be corrected or compensated. This information may be stored in a user supplied digital information storage device, generally on a circuit card associated with the particular sensor.

The accelerometer characterization information may be in the form of scale factor and bias coefficients of a polynomial function of temperature such as:

$$SF_A\_T_A = C0 + C1T_A + C2T_A + C3T_A \qquad (1)$$

and, $$B_A\_T_A = B0 + B1T_A + B2T_A + C3T_A \qquad (2)$$

where $T_A$ = temperature of accelerometer.

In turn, the navigation processor and control 160 may process the IADC 120 counter information, counters 128 and 130, as follows:

$$V(\text{new}) = V(\text{old}) + [DN(+)\text{-}DN(-)]*SF\_T_A + [-B_A\_T_A] + [R_I(\text{New})\text{-}R_I(\text{Old})] \qquad (3)$$

where
V(new) = current velocity
V(old) = previous velocity
(3A) DN(+) = N(+)-N(−) New values
(3B) DN(−) = N(+)-N(−) Old values
N(+) = raw value of counter 128
N(−) = raw value of counter 130
$SF_A\_T_A$ = accelerometer scale factor at $T_A$
$B_A\_T_A$ = accelerometer bias at $T_A$
[DN(+)-DN(−)] = incremental change in velocity, i.e., the integral of acceleration over a selected time period.
$R_I$ = analog residual output.

The operation of FIG. 1 will now be described. The analog accelerometer sensor 100 represents an acceleration to current converter having a gain K in units of milliamps/G. The integrator digitizer 122 serves as a current to pulse converter wherein each pulse represents a discrete velocity increment. As will be more fully described, one example of integrator digitizer 122 has a gain of 1,000 pulses/sec/ma. In turn, counters 128 and 130 are continuous counters in which each count increment represents a velocity increment of 0.032 ft/sec (assuming 1 G=32 ft/sec$^2$).

Although not shown, navigation processor and control 160 periodically reads the output of counters 128 and 130, and at the same time the sample and hold circuit 182 holds the output signal $R_I$ so as to provide an accumulated velocity representation as already expressed. Also, the A/D converter 190 digital representations are read by processor 160 of the accelerometer temperature and the value of $R_I$ through multiplexer 180. In turn, equation (3) is calculated and utilized by subsequent navigation position equations.

Figure 2:
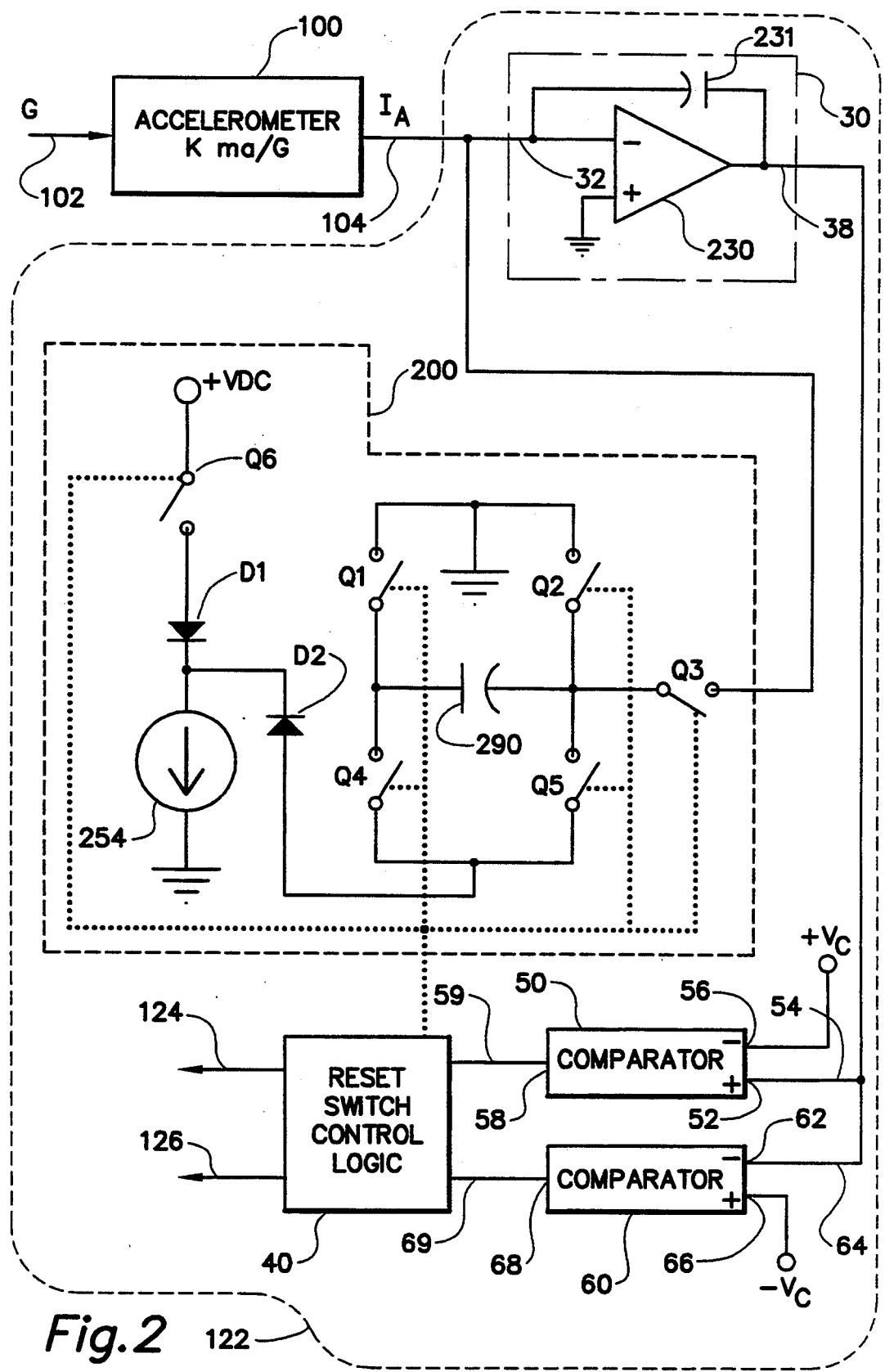
FIG. 2 is a block diagram illustrating one embodiment of a integrator-digitizer circuit.

Illustrated in FIG. 2 are further details of integrator digitizer 122 of FIG. 1 which forms, in pad, the integrating analog-to-digital converter 120 of FIG. 1 for deriving velocity information from an analog accelerometer 100. Similar functioning components as those of FIG. 1 have retained the same numbered designations in FIG. 2. Integrator digitizer 122 includes an integrator 30 having a signal input means 32 for receiving the analog output signal of accelerometer 100 on signal line 104. Input means 32 of integrator 30 is an inverting input relative to output means 38 of integrator 30. Integrator 30 further includes an output means 38 for providing an output signal on signal line 54 as an input to a comparator 50 at its positive input means 52, and on signal line 64 as an input to a comparator 60 at its negative input means 62.

Comparator 50 further includes a reference voltage +$V_C$ at the negative input means 56 thereof. Comparator 50 includes an output means 58 for providing an output signal on signal line 59. Similarly, comparator 60 includes a reference voltage $-V_C$ at its positive input means 66 thereof. Comparator 60 also includes an output means 68 for providing an output signal on signal line 69.

The output signal provided by comparator 50 is presented as a first input to reset switch control logic 40 on signal line 59, and comparator 60 provides its output signal to a second input to reset switch control logic 40 on signal line 69. Reset switch control logic is operative for controlling charge rebalance circuit 200 that is operative for resetting integrator 30 and also for providing a signal change or pulse on output signal lines 124 or 126, the signal lines presented to counters 128 and 130 of FIG. 1, respectively, as will be more fully described.

The system as particularly illustrated in FIGS. 1 & 2 is well known in the prior art as a technique for obtaining velocity information derived from the analog accelerometer 100 as aforesaid. More specifically, in the navigational arts, the analog accelerometer is integrated to provide velocity information to a navigational computer (not shown). IADC 120 provides such velocity information in digital form. In order to further understand the behavior of the system illustrated in FIGS. 1 and 2, the charge rebalance circuit 200 and reset switch control logic 40 will now be described.

Integrator 30, reset switch control logic 40, comparators 50 and 60, and charge rebalance circuit 200, form what may be referred to as a charge-rebalance digitizer. The purpose of the charge-rebalance digitizer is to convert the DC accelerometer output current to either pulse signals on signal line 124 or pulse signals on signal line 126, each representative of a velocity increment, and an integrator residual output $R_f$. The charge-rebalance digitizer of FIG. 2 is similar in form and function as that employed in the prior art. FIG. 2 illustrates one embodiment of a particular charge-rebalance circuit 200 including electronic switches Q1–Q6, capacitor 290, current source 254, and diodes D1 and D2. Again, pulses on signal line 124 will be associated with a negative accelerometer output current corresponding to one acceleration direction, and pulses on signal line 126 associated with a positive accelerometer output current corresponding to the opposite acceleration direction, as indicated by the dotted line electrical connections to comparators 50 and 60, respectively.

As described earlier, accelerometer 100 provides an output current as an input to precision reset-integrator 30 that includes amplifier 230 and feedback capacitor 231. The output of integrator 30 therefore represents the integration of the accelerometer output current (with inverted polarity), and therefore represents velocity. Application of the charge rebalance circuit 200 as will be described, converts the acceleration current to delta velocity pulses on signal lines 124 and 126, depending on the direction of the acceleration. The integrator output 38 feeds the two window comparators 50 and 60, one with a positive reference voltage and the other with a negative reference voltage, respectively. Whenever the integrator output voltage reaches either comparator reference voltage, the appropriate comparator triggers the reset switch control logic 40 through signal lines 59 and 69, which, in turn, initiates the resetting of integrator 30 and provides the appropriate pulse on either signal line 124 or 126.

The charge rebalance circuit 200 of FIG. 2 injects a precise amount of charge, either positive or negative, of one micro-coulomb into integrator capacitor 231 electrically connected between input means 32 and output means 38 of amplifier 230, which thereby resets the integrator output voltage to near zero. Each time the reset control logic 40 initiates the charge rebalance through charge rebalance circuit 200, the reset switch control logic generates a pulse signal on signal lines 124 or 126, as aforesaid.

Each signal change or pulse on signal lines 124 and 126 represents a precise amount of delta velocity since the closed-loop integrator resets each time the time-integral (ampere-seconds) of accelerometer current accumulates one micro-coulomb of charge (since 1 micro-coulomb = 1 micro-amp-sec). The rebalance charge is generated by injecting a precise current into capacitor 290 for a precise time; capacitor 290 is then discharged into integrator capacitor 231 for a rebalance as will now be briefly described.

The one micro-coulomb rebalance charge is created by passing a 32 mA current into the rebalance capacitor 290 for a precise time interval of 1/32 of a millisecond, thereby placing a charge of one micro-coulomb on capacitor 290. This charge is then dumped into the integrator capacitor 231, where it resets the integrator 30 output voltage 38 to near zero volts.

In FIG. 2, electronic switches identified as Q1-Q6 are electronically controlled by the reset switch control logic 40 as indicated by the dotted lines from switches Q1-Q6 to reset switch control logic 40. In the exposition that follows, the electronic switches will be referred to as being either open or closed.

Switch Q6 is preferably a high-speed bipolar switch circuit driven with a logic pulse from reset switch control logic 40 having a 1/32 ms duration. During a no-reset time, the input logic signal is "0" and switch Q6 is closed and provides an electrical connection between the +VDC and diode D1 of the diode OR network including diode D2; all of the controlled 32 mA from the current source flows through Q6 and no current charge's capacitor 290 (switches Q4 and Q5 being open). When a rebalance is required, switch Q6 input goes to a logic "1" for 1/32 ms, causing switch Q6 to open. Simultaneously, switches Q1, Q2, Q4 and Q5 are selectively closed which diverts the 32 mA current source through diode CR5 and capacitor 290; thus capacitor 290 takes on a 1 micro-coulomb charge (32 ma for 1/32 ms) having a polarity depending on the condition of switches Q1, Q2, Q4 and Q5. The selected polarity is, of course, dependent upon which comparator 50 or 60 was initiated to provide a signal change on either signal line 59 or 69 respectively, corresponding to a negative or positive acceleration output current and integral thereof.

During a charge-rebalance sequence, switches "Q1, Q2, Q4, and Q5," preferably FET transistor switches or the like, first connects one side of capacitor 290 to ground and connects the other side to Diode D2 to allow capacitor 290 to be charged with 1 micro-coulomb. The polarity of the charge on capacitor 290 is, of course, dependent upon which pair of switches is closed during the 1/32 ms charge-up portion—Q1 and Q5 forming one pair, and Q2 and Q4 forming the second pair. Switches Q1 and Q5 are closed to generate a rebalance for a positive accelerometer current; switches Q2 and Q4 are closed to generate a rebalance for a negative accelerometer output current. Switches Q1 and Q3 are closed to dump the rebalance charge into the integrator. After the 1/32 ms pulse, switch Q6 closes stopping any further charge of capacitor 290. Concurrently, switches Q2, Q4 and Q5 open and switches Q1 and Q3 close, allowing capacitor 290 to be connected between the integrator input means 32 through Q3 and ground through switch Q1. This action permits transfer of the charge on capacitor 290 to integrator capacitor 231.

The integrator 30 voltage during the time between rebalances or resets of the integrator, represents the partial velocity increment or partial count at the time the counters 128 or 130 are read by the navigation system processor 160. Accordingly, at such time that the counters are strobed, the integrator output voltage (herein referred to as the residual voltage $R_f$ is captured by sample and hold circuit 182 and is converted to a digital representation by AJD converter 190 as aforesaid and particularly illustrated in FIG. 1. The aforementioned strobe signal lines have been omitted in the drawing to avoid obfuscating the invention.

In summary, as a result of the transfer of charge to capacitor 231, the integrator output 38 will change in value toward zero and cause either comparator 50 or 60 to change state, and place these comparators in a condition waiting for the next rise or fall of the integrator voltage to exceed their respective reference voltage. Thus, each change in comparator output voltage from a first (normal) level to a second (tripped) level is representative of a delta velocity increment as aforesaid. It should be recognized that the comparator 50 and 60 output signals, or alternatively outputs 124 and 128, provide an output signal which has a repetition rate or frequency having a characteristic which is a function of the integral of the analog input current presented to integrator 30 for positive and negative input currents, respectively. In turn, their outputs are corrected as aforesaid to provide velocity increment information to a navigation computer.

The integrating analog-to-digital converter 120, as particularly illustrated in FIGS. 1 and 2, is sensitive to temperature, even under conditions where precision components are selected. Nevertheless, the digital representations $N(+)$ and $N(-)$ provided by counter 128 and 130, respectively are each independently sensitive to both scale factor and bias errors as a function of temperature due to the analog processing circuitry as is exemplified in FIGS. 1 and 2, as well as other integrating analog-to-digital converters.

Figure 3:
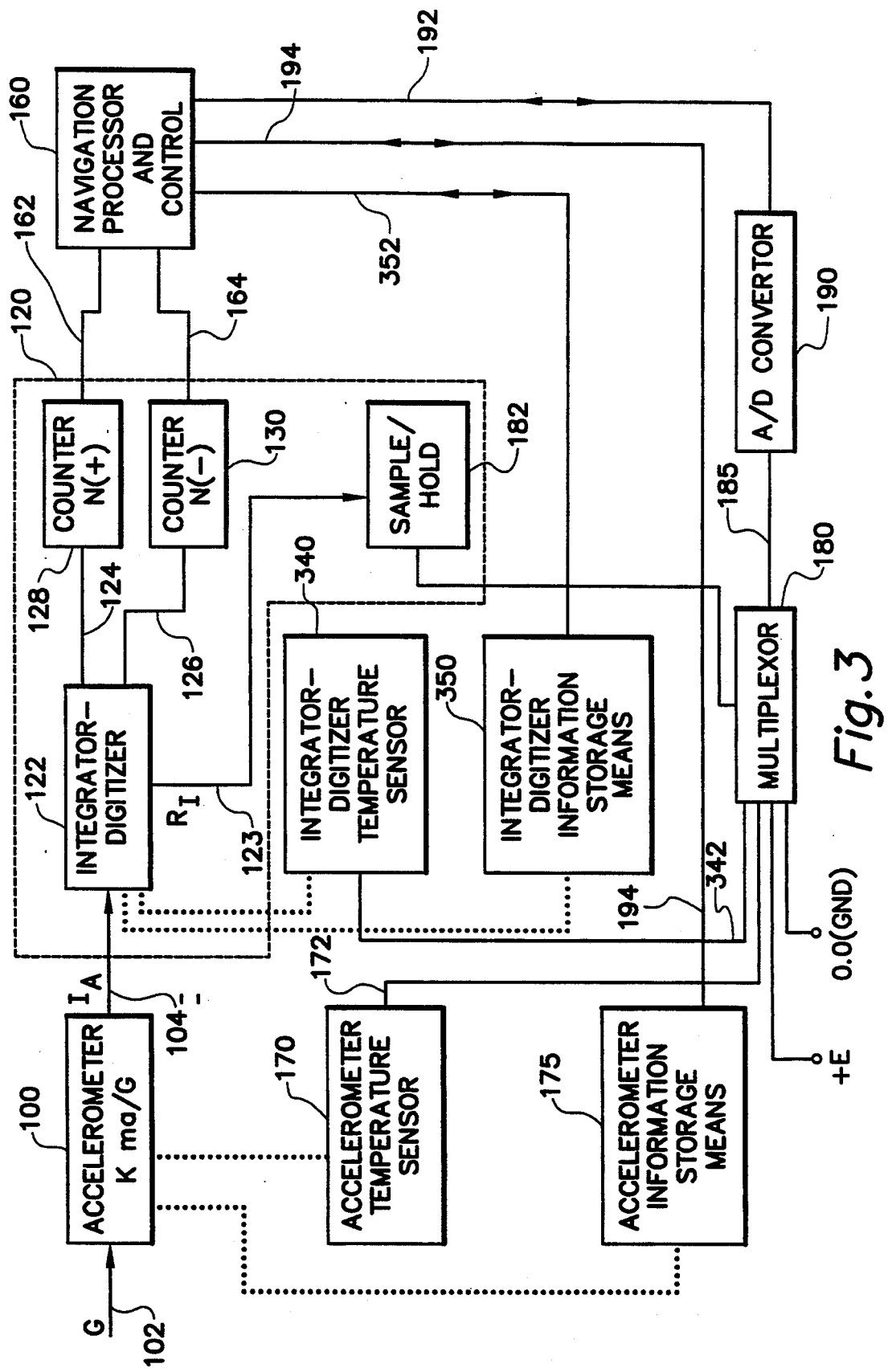
FIG. 3 is a block diagram illustrating an integrating analog-to-digital converter in accordance with the present invention in combination with an analog accelerometer.

To overcome these deficiencies, the present invention as particularly illustrated in FIG. 3 incorporates temperature sensing circuitry and integrating analog-to-digital converter temperature characteristic information that characterizes the scale factor and bias errors of the integrating analog-to-digital converter 120 to overcome the deficiencies of the prior art as will now be more fully described.

Referring now to FIG. 3, there shown is an integrating analog-to-digital converter similar to IADC 120 of FIG. 1 in accordance with the present invention. As before, similar functioning components as those in the preceding Figures have retained their same numeral designations in FIG. 3. Like FIG. 1, the system shown in FIG. 3 includes accelerometer 100, accelerometer temperature sensor 170, and accelerometer information storage means 175, each having the same function and serving in the same manner, and having the same output signal lines as FIG. 1. Further, in FIG. 3, multiplexer 180 receives as inputs the same inputs as those shown in FIG. 1, but also the analog output of integrator-digitizer temperature sensor 340 on signal line 342. In turn, the aforementioned analog signals are provided as an input to analog-to-digital converter 190 on signal line 185, and Converter 190 provides a digital output signal on signal line 192 presented as a digital input to navigation processor and control 160, like FIG. 1.

In FIG. 3, integrating analog-to-digital converter 120 includes the same components as illustrated in FIGS. 1. However, in accordance with the present invention, associated with IADC 120 are integrator-digitizer temperature sensor 340 and integrating analog-to-digital converter information storage means 350. Integrator-digitizer temperature sensor 340 provides an analog output signal representative of temperature on output signal line 342 presented as an additional input to multiplexer 180. Integrating analog-to-digital information storage means 350, like accelerometer information storage means 175, may also be a read only memory device. The contents of storage means 350 may be interrogated by data signal line 352, like signal line 194 in a manner also well known in the art. Integrating analog-to-digital converter storage means 350 is intended to contain information that characterizes the performance of the integrating analog-to-digital converter 120 as a function of temperature as will be further described in accordance with the present invention.

In the present invention, the IADC storage means 350 is intended to provide information descriptive of the temperature characteristics of the performance of the temperature dependent integrating analog-to-digital converter 120. These latter mentioned components are illustrated as having a dotted line connection indicating a unique association with a particular integrating analog-to-digital converter.

In the present invention, consider the implementation of the integrating analog-to-digital converter 120, at least in part, on a circuit card which includes, but not limited to, integrator-digitizer 122 including, but not limited to, integrator 30, comparators 50 and 60 having output signal lines 59 and 69 respectively, and charge rebalance circuit 200, functioning in the same manner as described with reference to FIGS. 1 and 2. In this scenario, the overall performance of the integrating analog-to-digital converter 120 will be temperature dependent upon the performance of the analog circuit components on the aforementioned circuit card. Therefore, in the preferred embodiment of the invention, temperature sensor 340 is intended to sense the ambient temperature of the circuit card, and more particularly to sense the ambient temperature of the most critical temperature dependent components thereon. Of course, the temperature of the circuit board is dependent upon not only the heat generated by the circuit board components, but also the heat, or the loss thereof, due to the operating limits of the enclosure housing the circuit board.

In the present invention, the most critical temperature dependent components are believed to be the performance of electronic switch Q6 and current source 254 depicted in FIG. 2. Therefore, temperature sensor 340 is intended to be most representative of the temperature of switch Q6 and current source 254. Of course, in the layout of the analog circuit components, the temperature sensor 340 is intended to be located on the circuit card in close proximity to the electronic switch Q6 and those components which form, at least in part, source 254. The remaining analog circuit components of the integrator-digitizer 122 should be located on the circuit card as close as possible, of course, to temperature sensor 340.

It should be noted that the remaining components, e.g., counters 128 and 130 and reset control logic 40 may be on the same circuit card or may be part of the navigation processor and control 160 remote from circuit card containing the analog circuit components. In the preferred embodiment of the invention the circuit card would also include storage means 340, however, it too may be also achieved by other means on other circuit cards.

As indicated earlier, variations in the circuit board temperature may cause variations in the performance of IADC 120, and thereby temperature dependent variations in the digital representation of the velocity increments indicated by the output pulses or signal changes of comparators 50 and 60. In accordance with the present invention, these temperature based errors may be removed by appropriately characterizing the circuit board as a function of temperature. These temperature based errors may be classified as, but not limited to, a bias error and a scale factor error. A source of these errors is thought to be, but not limited to, variation in the precision of resetting or rebalancing integrator capacitor 231 with a precise quantity of charge. When employing a charge rebalancing circuit as particularly illustrated in Figure 2, the speed of the Q6 switch to an open position for precisely 1/32 ms is most critical to uniformly reset the integrator by changing the charge on capacitor 231 by one micro-coulomb. Any temperature dependent errors of the IADC 120 may be characterized by a polynomial expression as a function of temperature in a manner as will now be described.

Figure 4:
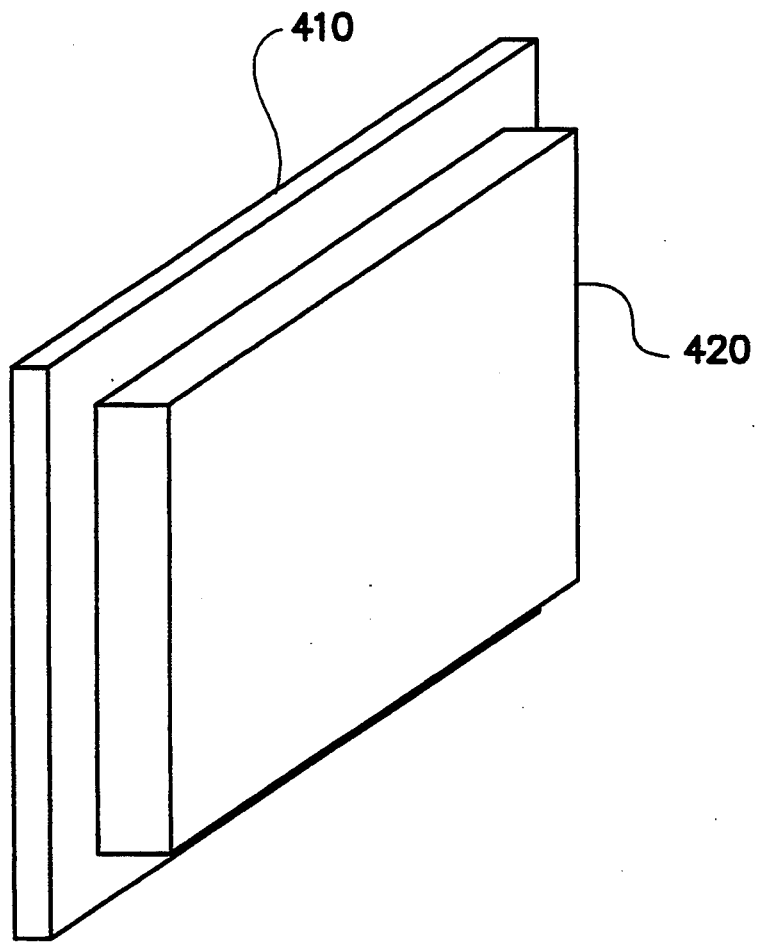
FIG. 4 is a isometric view of an electronic card with thermal cover.

Referring to FIG. 4, in the preferred embodiment of the invention the circuit card 410 including the aforementioned integrator-to-digitizer components is preferably covered with a heat spreading cover 420 as particularly illustrated in FIG. 4. In turn, the thermal cover is intended to be in mechanical contact with a housing (not shown) for the intended application so that the housing serves as a thermal heat sink. Further, the space between the cover and the circuit components may also be filled with a thermally conducting material. These features are intended to minimize any temperature gradients from one component to the next.

Integrating Analog-to-Digital Converter Characteristics

The temperature characterization of integrator digitizer 120 is determined firstly by a series of measurements and secondly by a two-step analysis of the measurements to generate IADC characteristic mathematical expression as function of temperature. During the measurement portion the following empirical data is obtained. With the circuit card at a known stable temperature, the output signal value of temperature sensor 340 is recorded. Also, the frequency output of comparators 50 and 60 are recorded for various precise values of positive and negative input current fed into input means 32 of integrator 30 on signal line 104.

For example, assuming a perfect A/D converter 190 illustrated in FIG. 3, the digital value of the temperature sensed by temperature sensor 340 is recorded. With a stable temperature, the frequency of the output signal changes of comparator 60 are measured for each positive current input having values 0.5, 1.0, 1.5, 2.0, 2.5, 3.0, 3.5, and 4.0 ma. Similarly, the frequency of the signal changes of comparator 50 are measured for each negative current input having the same magnitudes as aforesaid. This procedure is then repeated for a selected number of different temperatures, e.g., +25, −25, 0, +30, +50, +75 degrees centigrade. The temperature and current values are selected, of course, based on the presumed operating temperature and the usual accelerometer operating limits and typical range of values.

Having the above information, the Integrating Analog-to-Digital Converter circuit 122 may be characterized by the following two-step analysis of the aforesaid measurements. Step one of the analysis computes the normalized scale-factors for both positive and negative input currents, for each of the seven temperatures. Step two of the analysis computes the polynomial coefficients that model the normalized scale factors of step one vs. the integrating analog-to-digital converter (IADC) temperature signal derived from temperature sensor 340. During step one, firstly, for each of the seven different temperatures, the Scale Factor relating positive accelerometer current to pulse frequency output on signal line 124, defined as SF(+), is computed by performing a least-squares straight-line fit of measured output frequency values on signal line 124 vs. the eight positive input current values. Secondly, during step one, for each of the seven different temperatures, the Scale Factor relating negative accelerometer current to pulse frequency output on signal line 126, defined as SF(−), is computed by performing a least-squares straight-line fit of measured output frequency values on signal line 126 vs. the eight negative input current values.

Some IADC circuits may have a temperature dependent bias error ($B_{IADC}$) that is smaller than what can be determined by the measurements above in conjunction with the analysis of step one above. In this special case the bias error can be defined as zero, or else an actual small value determined by other means. In the following exposition, it is assumed that bias error computations use a forced zero intercept. Here, the units of scale factor are Hz/ma where zero current is forced to be zero Hertz.

In turn the seven IADC scale factor values of SF(+) and the seven IADC scale factor values of SF(−) corresponding to each of the seven temperatures are normalized:

$$\text{Norm\_SF}(+) = (1000 \text{ Hz/ma})/SF(+) \tag{4}$$

$$\text{Norm\_SF}(-) = (1000 \text{ Hz/ma})/SF(-) \tag{5}$$

$$B_{IADC} = \text{Zero for this special case.} \tag{6}$$

where Norm\_SF(±) is a number having no units.

COMPENSATION

In accordance with the present invention, the counter values N(+) and N(−) of counter 128 and 130 respectively are corrected in accordance with the following compensation algorithm before being used as a digital representation for navigation information purposes. Before proceeding, "N" values refers to counter values. It should be recognized that counters 128 and 130 represent a count of pulses on signal lines 124 and 126, respectively. Further, it should be noted that the normalized scale factor of the pulse frequencies may be directly applied to the raw counter output of counters 128 and 128, each having it own characteristic behavior corresponding to the positive and negative accelerometer output of signals 124 and 126 current values. This is so since a change in frequency is a change in counts/sec. indicated by counters 128 and 130. Accordingly, again using the special case of zero bias error:

$$\text{Compensated\_}N(+) = \text{RAW\_}N(+) * \text{Norm\_}SF(+)\_V(T) \quad (7)$$

$$\text{Compensated\_}N(-) = \text{RAW\_}N(-) * \text{Norm\_}SF(-)\_V(T) \quad (8)$$

where

RAW_$N(+)$ and RAW_$N(-)$ are the outputs of counters 128 and 130 respectively, and where Norm_SF(+)_V(T) and Norm_SF(−)_V(T) are normalized scale-factors expressed as a function of temperature that are defined by the following polynomials:

$$\text{Norm\_}SF(+)\_V(T) = C0^* + C1^*V(T) + C2^*V(T)^2 + C3^*V(T)^3 + C4^*V(T)^4 \quad (9)$$

$$\text{Norm\_}SF(-)\_V(T) = D0^* + D1^*V(T) + D2^*V(T)^2 + D3^*V(T)^3 + D4^*V(T)^4 \quad (10)$$

$$\text{Bias\_}V(T) = B0^* + B1^*V(T) + B2^*V(T)^2 + B3^*V(T)^3 + B4^*V(T)^4 \quad (11)$$

Where

V(T) is the digital representation of the sensed temperature of integrating-analog-to-digital converter temperature sensor 340.

Equation (11) is the general case. For the special case of zero bias, the coefficients B0 through B4 are set to zero.

In step two of the analysis, the polynomial coefficients in the above equations are determined by performing a 4th order polynomial least squares fit of Norm_SF(+)_V(T) vs. V(T); and Norm_SF(−)_V(T) vs. V(T) using the above mentioned measurements and calculations. More specifically, in step one of the analysis, Norm_SF(+) and Norm_SF(−) are calculated based on measured values of the pulse frequencies on signal lines 128 and 130 (initiated by comparators 50 and 60, respectively) and known values of IADC input current. Then in step two of the analysis, the polynomial coefficients are computed—these coefficients separately modeling the normalized scale-factors vs. IADC temperature output V(T) for both the positive and negative IADC input currents. In the preferred embodiment of the invention, the IADC characteristic coefficients are stored in information storage means 350 for interrogation as will now be described.

During system operation Norm_SF(+) and Norm_SF(−) are continually computed, equations (9) and (10), as a function of the IADC temperature signal, using the polynomial coefficients retrieved from storage means 350. In practice of the present invention, for each request, navigation data processor and control 160 cycle reads the raw counter values of counters 128 and 130, the digital value of accelerometer temperature sensor 170 and digital value of IADC temperature sensor 340. During a previous start up routine, the navigation processor and control 160 reads the stored temperature characteristic information, more specifically the temperature characteristic coefficients, as aforesaid, of both the accelerometer information storage means 175 and the IADC information storage means 350. With this information, the normalized scale factor for the IADC 120 is calculated for both counters, and the raw count of each counter is corrected as mathematically depicted in equations (7) and (8).

After the raw count of counter 128 and 130 are corrected, their value difference is calculated as described by equation (3A) and (3B). In turn these values are used in equation (3) which includes the accelerometer scale factor and bias corrections depicted by equations (1) and (2).

The integrating analog-to-digital converter, including a temperature sensor and information storage means in accordance with the present invention, may be utilized as a replacement for integrating analog-to-digital converters of the prior art for converting analog accelerometer output signals to digital converters of the prior art converting analog accelerometer output signals to digital forms for use in the navigational arts.

Further, it also within the scope of the present invention that such temperature characterization schemes illustrated herein may be employed more generally with analog-to-digital converters.

It should be noted that the accelerometer scale factor correction SF_TA is generally a scalar quantity as expressed in equation (3). Also, the scale factor corrections for both the positive and negative input currents of the integrating analog-to-digital converter 120 as expressed by equations (7) and (8), namely Norm_SF(+)_V(T) and Norm_SF_(−)_V(T), are scalar quantities. Therefore, the order of correction or compensation of the raw counter values N(+) and N(−) by the IADC scale factor corrections expressed by equations (7) and (8), and the accelerometer scale factor corrections expressed by equation (3) are unimportant. Therefore, alternatively to the analysis described above, the accelerometer scale factor correction may be applied to the individual counter values before being corrected for the IADC scale factor, and subsequent difference calculation described by equation (3).

In the preceding exposition, an integrating-analog-to digital is converter has been illustrated to include a temperature sensor and an information storage means which characterizes the temperature dependent performance of the integrating-analog-to-digital converter. The location of the temperature sensor has been suggested herein for a particular analog circuit component implementation of the integrating analog-to-digital converter, and a specific technique for characterizing the temperature dependent performance has also been suggested. Nevertheless, it is within the spirit and scope of the present invention to apply the teachings of the present invention embodied with other analog implementations and characterization schemes to be within the scope of the present invention and accompanying claims.

The integrating analog-to-digital converter, including a temperature sensor and information storage means in accordance with the present invention, may be utilized as a replacement for integrating analog-to-digital converters of the prior art for converting analog accelerometer output signals to digital converters of the prior art converting analog accelerometer output signals to digital forms for use in the navigational arts.

Further, it also within the scope of the present invention that such temperature characterization schemes illustrated herein may be employed more generally with analog-to-digital converters.

The embodiments of an invention in which an exclusive property or right is claimed are defined as follows:

1. An integrating analog-to-digital converter for converting an analog input signal to a digital representation thereof, said integrating analog-to-digital converter comprising:

analog means for generating an analog input signal;

first temperature sensing means for providing an analog means temperature output signal representative of the temperature of said analog means;

first storage means for storing first information descriptive of the temperature characteristic of said analog means so that a signal representative of said analog means may be corrected as a function of said analog means temperature output signal and said first information;

circuit means responsive to said analog input signal for providing an output signal which changes between at least first and second levels having a frequency characteristic as a function of the integral of said analog input signal;

at least a first counter means responsive to said circuit means output signal for counting said signal changes thereof changing from said first level to said second level, and providing a first counter means output representative of said count;

second temperature sensing means for providing a circuit means temperature output signal representative of the temperature of a selected ambient temperature region in proximity to said circuit means; and second storage means for storing circuit second information descriptive of the temperature characteristic of said circuit means so as to be descriptive of the performance of said integrating analog-to-digital converter so that at least said first counter means may be corrected as a function of said circuit means temperature output signal and said second information.

2. The integrating analog-to-digital converter of claim 1 further including digital signal processing means operative for generating a digital output representative of a function of said first counter means output and a scalar quantity where said scalar quantity is a function of said converter information and said circuit means temperature output signal.

3. The integrating analog-to-digital converter of claim 1 where said temperature characteristic of said circuit means is related to scale factor which relates the analog input signal with said first counter means output.

4. The integrating analog-to-digital converter of claim 1 wherein said second information includes coefficients of a polynomial which characterize the temperature characteristic of said temperature characteristic of said circuit means descriptive of the performance of said integrating analog-to-digital-converter.

5. The integrating analog-to-digital converter of claim 4 where said temperature characteristic of said circuit means is related to scale factor which relates the analog input signal with said first counter means output.

6. The integrating analog-to-digital converter of claim 1 wherein:

said circuit means is further responsive to said analog input signal for providing said first output signal as a function of the integral of positive values of said analog input signal, and a second output signal which changes between at least first and second levels having a frequency characteristic as a function of the integral of negative values of said analog input signal; and said converter further including a second counter means responsive to said circuit means second output signal for counting said signal changes thereof changing from said first level to said second level, and providing a second counter means output representative of said second counter count.

7. The integrating analog-to-digital converter of claim 6 further including digital signal processing means operative for generating a digital output representative of:

(i) a function of said first counter means output and a first scalar quantity corresponding to positive values of said analog input signal, where said first scalar quantity is a function of said second information corresponding to positive values of said analog input signal and said circuit means temperature output signal; and (ii) a function of said second counter means output and a second scalar quantity corresponding to negative values of said analog input signal, where said second scalar quantity is a function of said second second information corresponding to negative values of said analog input signal and said circuit means temperature output signal.

8. The integrating analog-to-digital second of claim 7 wherein:

said converter information includes first set of coefficients of a first polynomial which characterize said first scalar quantity where said first scalar quantity is a function of said converter temperature output signal for positive values of said analog input signal; and a second set of coefficients of a second polynomial which characterize said second scalar quantity where said second scalar quantity is a function of said converter temperature output signal for negative values of said analog input signal.

9. The integrating analog-to-digital converter of claim 6 further including digital signal processing means operative for generating:

(i) a digital output represented of a function of said first counter means output and a first scalar quantity corresponding to positive values of said analog input signal, where said first scalar quantity is a function of said converter information corresponding to positive values of said analog input signal and said circuit means temperature output signal; and (ii) a digital output representative of a function of said second counter means output and a second scalar quantity corresponding to negative values of said analog input signal, where said second scalar quantity is a function of said converter information corresponding to negative values of said analog input signal and said circuit means temperature output signal.

10. The integrating analog-to-digital converter of claim 9 wherein said second information includes:

a first set of coefficients of a first polynomial which characterize said first scalar quantity where said first scalar quantity is a function of said converter temperature output signal for positive values of said analog input signal; and a second set of coefficients of a second polynomial which characterize said second scalar quantity where said first scalar quantity is a function of said converter temperature output signal for negative values of said analog input signal.

11. The integrating analog-to-digital converter of claim 1 wherein said second information includes a first set of coefficients of a first polynomial defining said first selected quantity, said first selected quantity being a first scalar quantity where said first scalar quantity is a function of said converter temperature output signal and said first set of coefficients for correcting said first counter means output by said first scalar quantity.

12. An apparatus for obtaining acceleration information derived from sensed acceleration along a predetermined input axis, said apparatus comprising:
- an analog accelerometer for providing an analog output signal having sign and magnitude representative of the acceleration sensed by said analog accelerometer along the input axes thereof;
- an accelerometer temperature sensing means for providing an accelerometer temperature output signal representative of the temperature of said analog accelerometer;
- means for storing accelerometer information descriptive of the temperature characteristic of at least one selected quantity descriptive of the performance of said analog accelerometer;
- an integrating digital-to-analog converter for converting said accelerometer analog output signal to a digital representation thereof, said integrating analog-to-digital converter including,
  - an integrator-digitizer having an input means responsive to said accelerometer analog output signal, and having at least one output signal for providing a selected signal change between first and second levels having a frequency characteristic as a function of the integral of said accelerometer analog output signal,
  - integrator-digitizer temperature sensing means for providing an integrator-digitizer temperature output signal representative of a selected ambient temperature region in proximity to one or more analog circuit components of said integrator-digitizer means;
  - means for storing integrator-digitizer information representative of the temperature characteristic of at least one selected quantity descriptive of the performance of said integrator-digitizer at least first output signal, and
  - at least a first counter means for providing a first counter output representative of an accumulative count of said selected signal change of said integrator digitizer output signal; and
- signal processor and control means responsive to (i) said first counter means output signal, (ii) said accelerometer temperature output signal, (iii) said integrator-digitizer temperature output signal, (iv) said accelerometer information, and(v) said integrator-digitizer information for generating acceleration information sensed by said accelerometer as a function of said first counter means output signal corrected by a first scalar quantity which is a function of said integrator-digitizer temperature output signal and said integrator-digitizer information, and by an accelerometer scalar quantity which is a function of said accelerometer temperature output signal and said accelerometer information.

13. The apparatus of claim 12 further including digital signal processing means operative for generating a digital output representative of a function of said first counter means output and a first scalar quantity where said first scalar quantity is a function of said converter information and said circuit means temperature output signal.

14. The apparatus of claim 12 where said first scalar quantity is related to scale factor which relates the accelerometer analog output signal with said first counter means output.

15. The apparatus of claim 12 wherein said converter information includes coefficients of a polynomial which characterize the temperature characteristic of said first scalar quantity which is descriptive of the performance of said integrating analog-to-digital-converter.

16. The apparatus of claim 12 wherein said integrator-digitizer is further responsive to said accelerometer analog output signal for providing said first output signal as a function of the integral of positive values of said accelerometer analog output signal, and a second output signal which changes between at least first and second levels having a frequency characteristic as a function of the integral of negative values of said accelerometer analog output signal, and said converter further including a second counter means responsive to said integrator-digitizer second output signal for counting said signal changes thereof changing from said first level to said second level, and providing a second counter means output representative of said second counter count.

17. The apparatus of claim 12 wherein said signal processor and control means is operative for generating:
  (i) a digital output representative of a function of said first counter means output and a first scalar quantity corresponding to positive values of said accelerometer analog output signal, where said first scalar quantity is a function of said converter information corresponding to positive values of said accelerometer analog output signal and said circuit means temperature output signal, and
  (ii) a digital output representative of a function of said second counter means output and a second scalar quantity corresponding to negative values of said accelerometer analog output signal, where said second scalar quantity is a function of said converter information corresponding to negative values of said accelerometer analog output signal and said circuit means temperature output signal.

18. The integrating analog-to-digital converter of claim 17 wherein said converter information includes a first set of coefficients of a first polynomial defining said first selected quantity, said first selected quantity being said first scalar quantity which is a function of said converter temperature output signal and said first set of coefficients for correcting said first counter means output by said first scalar quantity.

19. The apparatus of claim 12 wherein said signal processor and control means is operative for generating a digital output representative of:
  (i) a function of said first counter means output and a first scalar quantity corresponding to positive values of said accelerometer analog output signal, where said first scalar quantity is a function of said converter information corresponding to positive values of said accelerometer analog output signal and said circuit means temperature output signal, and
  (ii) a function of said second counter means output and a second scalar quantity corresponding to negative values of said accelerometer analog output signal, where said second scalar quantity is a function of said converter information corresponding to negative values of said accelerometer analog output signal and said circuit means temperature output signal.

20. The integrating analog-to-digital converter of claim 17 wherein said converter information includes:
first set of coefficients of a first polynomial which characterize said first scalar quantity where said first scalar quantity is a function of said converter temperature output signal for positive values of said accelerometer analog output signal; and
a second set of coefficients of a second polynomial which characterize said second scalar quantity where said second scalar quantity is a function of said converter temperature output signal for negative values of said accelerometer analog output signal.

21. The integrating analog-to-digital converter of claim 12 wherein said converter information includes:
a first set of coefficients of a first polynomial which characterize said first scalar quantity where said first scalar quantity is a function of said converter temperature output signal for positive values of said accelerometer analog output signal; and
a second set of coefficients of a second polynomial which characterize said second scalar quantity where said second scalar quantity is a function of said converter temperature output signal for negative values of said accelerometer analog output signal.

22. An Analog-to-digital converter for converting an analog signal from an analog sensing device to a digital signal, the converter comprising:
circuit card means, including:
analog circuit components which serve, in part, as an integrator-digitizer circuit for providing an output signal defined by a selected signal change between at least first and second levels having a frequency characteristic as a function of said analog signal; and
a temperature sensing means for providing a first circuit card temperature output signal representative of the temperature of said analog sensing device and a second circuit card temperature output signal representative of the temperature of a selected region of said circuit card;
means for storing circuit card information descriptive of the temperature characteristics of said analog sensing device and of at least one selected quantity descriptive of the performance of said integrator-digitizer;
at least a first counter means for providing a first counter output representative of an accumulation over a selected time period of said signal changes of said first and second circuit card temperature output signals; and
correction means independently responsive to said first and second circuit card temperature output signals for separately correcting said first counter output.

* * * * *